(12) United States Patent
Hiraide

(10) Patent No.: US 8,094,566 B2
(45) Date of Patent: Jan. 10, 2012

(54) TEST APPARATUS AND TEST METHOD

(75) Inventor: Mamoru Hiraide, Saitama (JP)

(73) Assignee: Advantest Corporation, Tokyo (JP)

( * ) Notice: Subject to any disclaimer, the term of this patent is extended or adjusted under 35 U.S.C. 154(b) by 124 days.

(21) Appl. No.: 12/647,294

(22) Filed: Dec. 24, 2009

(65) Prior Publication Data

US 2011/0158103 A1 Jun. 30, 2011

(51) Int. Cl.
*H04L 12/26* (2006.01)
(52) U.S. Cl. .................................... 370/241; 370/465
(58) Field of Classification Search .................. 370/241, 370/242, 465, 466, 474, 244
See application file for complete search history.

(56) References Cited

U.S. PATENT DOCUMENTS

| | | |
|---|---|---|
| 2004/0193990 A1 | 9/2004 | Ichiyoshi |
| 2004/0255216 A1 | 12/2004 | Ichiyoshi |
| 2006/0241885 A1* | 10/2006 | Ikeda ........................... 702/108 |
| 2008/0016396 A1* | 1/2008 | Higashi et al. .................. 714/30 |
| 2008/0129313 A1* | 6/2008 | Iwamoto ...................... 324/555 |
| 2010/0027536 A1* | 2/2010 | Jorgens et al. ................ 370/389 |
| 2010/0102840 A1* | 4/2010 | Ueda et al. .................... 324/755 |
| 2010/0169714 A1* | 7/2010 | Takahashi ....................... 714/37 |
| 2010/0189003 A1 | 7/2010 | Kozuka |
| 2011/0057663 A1* | 3/2011 | Iwamoto et al. .............. 324/537 |
| 2011/0057673 A1* | 3/2011 | Iwamoto et al. ........... 324/750.3 |

FOREIGN PATENT DOCUMENTS

| | | |
|---|---|---|
| WO | 2004/088339 A1 | 10/2004 |
| WO | 2009/011033 A1 | 1/2009 |

OTHER PUBLICATIONS

Evans, "The New ATE: Protocol Aware", Test Conference, IEEE International, Oct. 2007, pp. 1-10, Santa Clara, CA.

* cited by examiner

*Primary Examiner* — Brian Nguyen
(74) *Attorney, Agent, or Firm* — Chen Yoshimura LLP

(57) ABSTRACT

Provided is a test apparatus that tests a device under test, comprising a test module section that tests the device under test; a test control section that generates control packets for controlling the test module section; and a connecting section that receives the control packets from the test control section and transmits the control packets to the test module section. The test module section includes a first test module that operates according to control packets having a first packet structure and a second test module that operates according to control packets having a second packet structure, which is obtained by adding an expansion region to a control packet having the first packet structure, the test control section transmits control packets having the second packet structure to the connecting section, and the connecting section (i) removes the expansion region from control packets having the second packet structure received from the test control section and transmits the resulting control packets to the first test module, and (ii) transmits control packets having the second packet structure received from the test control section to the second test module.

10 Claims, 8 Drawing Sheets

| CODE | COMMAND | SUB_CODE | SUB-COMMAND |
|---|---|---|---|
| 0×00 | IDLE | | |
| 0×01 | RESET | | |
| 0×02 | READ | 0×00 | Signal Read Request |
| | | 0×02 | Multiple OR Read Request |
| | | 0×04 | Multiple AND Read Request |
| 0×03 | BURST_READ | | |
| 0×04 | WRITE | 0×00 | Signal Write Request |
| | | 0×02 | Multiple Write Request |

FIG. 5

TEST APPARATUS AND TEST METHOD

BACKGROUND

1. Technical Field

The present invention relates to a test apparatus and a test method.

2. Related Art

A test apparatus for testing a device under test is provided with a plurality of test modules. Each test module is connected to a terminal of the device under test to test the device under test. Each test module is controlled by a test control section having a control circuit such as a microprocessor.

The test control section controls the test modules by sending to each test module control packets including control instructions. For example, the test control section may send to each test module a control packet that includes a read command for reading data from a register of the device under test and a control packet that includes a write command for writing data to a register of the device under test.

When the test apparatus is provided with a plurality of different types of test modules, however, the test control section cannot control all of the test modules using a single type of control packet. For example, when the test apparatus includes a test module that can only receive a control packet having a first packet structure and also a test module that can only receive a control packet having a second packet structure, different types of control packets must be sent to these test modules. As a result, the hardware circuitry of the test control section is increased or the size of the program that causes the microprocessor to operate increases. Here, "packet structure" refers to the form of a control packet determined according to the type of information stored in the control packet and the order in which the information is stored.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a test module section that tests the device under test; a test control section that generates control packets for controlling the test module section; and a connecting section that receives the control packets from the test control section and transmits the control packets to the test module section. The test module section includes a first test module that operates according to control packets having a first packet structure and a second test module that operates according to control packets having a second packet structure, which is obtained by adding an expansion region to a control packet having the first packet structure, the test control section transmits control packets having the second packet structure to the connecting section, and the connecting section (i) removes the expansion region from control packets having the second packet structure received from the test control section and transmits the resulting control packets to the first test module, and (ii) transmits control packets having the second packet structure received from the test control section to the second test module.

The connecting section may include a converting section that removes the expansion region, and a storage section that stores the expansion region removed by the converting section. When test module identification information, which is included in a control packet received from the test control section and indicates a type of the test module that transmitted the control packet, indicates the first test module, the connecting section may remove the expansion region from the control packet, transmits the resulting control packet to the first test module, and store the removed expansion region in the storage section, and when the test module identification information indicates the second test module, the connecting section may transmit the control packet to the second test module.

The connecting section may generate a control packet having the second packet structure by using the converting section to add the expansion region stored in the storage section to a control packet having the first packet structure received from the first test module, and transmit the generated control packet having the second packet structure to the test control section, and the connecting section may transmit a control packet having the second packet structure received from the second test module to the test control section without passing the control packet having the second structure through the converting section.

The test control section may generate the control packets to include in the expansion region thereof commands that can be performed by the second test module but cannot be performed by the first test module. The test control section may generate the control packets to include, in a region thereof other than the expansion region, a common command that can be used by both the first test module and the second test module and to include, in the expansion region, a plurality of subcommands that order a plurality of operations that are obtained by segmenting an operation ordered by the common command. The test control section may generate control packets having the second packet structure to include the test module identification information indicating whether a destination of the control packet is the first test module, the second test module, or both the first test module and the second test module.

When the test module identification information indicates that the destination of the control packet is both the first test module and the second test module, the connecting section may (i) transmit the control packet to the second test module and (ii) remove the expansion region from the control packet and transmits the resulting control packet having the first packet structure to the first test module.

According to a second aspect related to the innovations herein, one exemplary test method may include a method for testing a signal device under test using a test module section that includes a first test module that operates according to control packets having a first packet structure and a second test module that operates according to control packets having a second packet structure, which is obtained by adding an expansion region to a control packet having the first packet structure, the method comprising generating control packets having the second packet structure to control the test module section; and (i) removing the expansion region from control packets having the second packet structure and transmitting the resulting control packets to the first test module, and (ii) transmitting control packets having the second packet structure to the second test module.

According to a third aspect related to the innovations herein, one exemplary recording medium may include a recording medium storing thereon a program for a test apparatus including a test module section that tests the device under test, a test control section that generates control packets for controlling the test module section, and a connecting section that receives the control packets from the test control section and transmits the control packets to the test module section, wherein the program causes the test module section to function as a first test module that operates according to control packets having a first packet structure and as a second test module that operates according to control packets having a second packet structure, which is obtained by adding an expansion region to a control packet having the first packet structure, the program causes the test control section to transmit control packets having the second packet structure to the connecting section, and the program causes the connecting section to (i) remove the expansion region from control packets having the second packet structure received from the test control section and transmit the resulting control packets to the first test module, and to (ii) transmit control packets having the second packet structure received from the test control section to the second test module.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 5 shows exemplary configurations of commands stored in the first command region and commands stored in the second command region.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
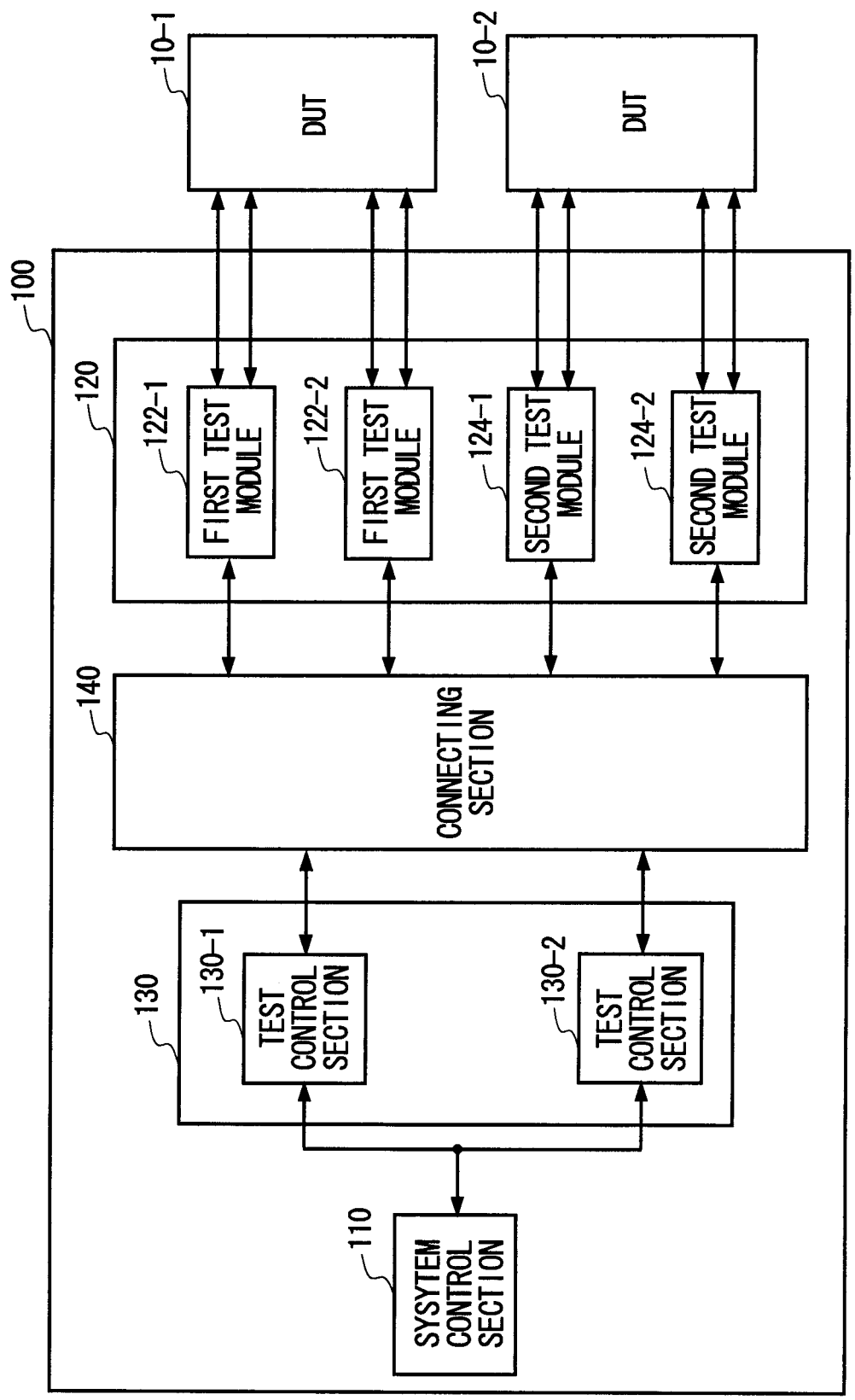
FIG. 1 shows a configuration of a test apparatus 100 according to an embodiment of the present invention.

FIG. 1 shows a configuration of a test apparatus 100 according to an embodiment of the present invention. The test apparatus 100 may test a plurality of devices under test 10, in this example a device under test 10-1 and a device under test 10-2. The test apparatus 100 includes a system control section 110, a test module section 120, a test control section 130, and a connecting section 140. The test control section 130 may include a test control section 130-1 and a test control section 130-2.

The system control section 110 may include a microprocessor that operates according to instructions contained in a program. The system control section 110 controls testing of the device under test 10-1 and the device under test 10-2 by controlling the corresponding test control section 130-1 and test control section 130-2.

The test module section 120 tests the device under test 10-1 and the device under test 10-2. For example, the test module section 120 inputs test signals having prescribed logic patterns to the device under test 10-1 and the device under test 10-2. The test module section 120 judges acceptability of the device under test 10-1 and the device under test 10-2 by making a comparison between (i) response signals output by the device under test 10-1 and the device under test 10-2 in response to the test signals and (ii) expected values corresponding to the logic patterns of the test signals.

The test module section 120 includes a first test module 122 and a second test module 124. As an example, the test module section 120 may include a first test module 122-1, a first test module 122-2, a second test module 124-1, and a second test module 124-2.

The first test modules 122 operate according to control packets having a first packet structure. For example, the first test modules 122 may receive from the test control section 130-1 control packets having a first packet structure that includes a first command region, an address region, and a data region. In addition, the first test modules 122 transfer control packets having the first packet structure to the test control section 130-1.

The first command region stores a read command that orders reading of data from a register in the device under test 10-1 and a write command that orders writing of data to a register in the device under test 10-1. The address region stores address information that identifies an address of a register in the device under test 10-1. The data region stores the data that is to be written to registers of the first test modules 122 designated by the address information.

The second test modules 124 operate according to control packets having a second packet structure, which includes an expansion region in addition to the first packet structure. The expansion region may be a second command region for storing commands that cannot be executed by the first test modules 122, regardless of whether the second test modules 124 can execute these commands. The second test modules 124 may receive, from the test control section 130-2, control packets having the second packet structure including the first command region, the second command region, the address region, and the data region. In addition, the second test modules 124 transmit to the test control section 130-2 control packets having the second packet structure.

The test control section 130 generates control packets for controlling the test module section 120. The test control section 130-1 and the test control section 130-2 may each be provided to correspond to one or more devices under test 10 from among the devices under test 10 being tested by the test apparatus 100. Each test control section 130 may control the first test modules 122 and the second test modules 124 according to control instructions and a test program or the like supplied from the system control section 110.

The connecting section 140 transmits each control packet received from the test control section 130-1 or the test control section 130-2 to one of the first test module 122-1, the first test module 122-2, the second test module 124-1, and the second test module 124-2. The connecting section 140 transmits each control packet received from one of the first test module 122-1, the first test module 122-2, the second test module 124-1, and the second test module 124-2 to the test control section 130-1 or the test control section 130-2.

The test control section 130 transmits control packets having the second packet structure to the connecting section 140. For example, the test control section 130 transmits to the connecting section 140 the control packets having the second packet structure including the first command region, the second command region, the address region, and the data region.

The connecting section 140 removes the expansion region portion from the control packets having the second packet structure received from the test control section 130, and transmits the resulting packets to the first test modules 122. More specifically, the connecting section 140 generates control packets by removing the second command region from among the first command region, the second command region, the address region, and the data region included in control packets having the second packet structure. In other words, the connecting section 140 converts control packets having the second packet structure received from the test control section 130 into control packets having the first packet structure, which includes the first command region, the address region, and the data region. The connecting section 140 transmits these control packets having the first packet structure to the first test modules 122.

The connecting section 140 transmits to the second test modules 124 the control packets having the second packet structure received from the test control section 130. In other words, the connecting section 140 transmits the control packets having the second packet structure received from the test control section 130 to the second test modules 124 without altering or removing the first command region, the second command region, the address region, or the data region included in these control packets.

By transmitting the control packets having the second packet structure in the manner described above, the test control section 130 can control the first test modules 122 that cannot receive the control packets having the second packet structure. In other words, the test apparatus 100 can test the device under test 10-1 and the device under test 10-2 using different types of test modules, i.e. the first test modules 122 and second test modules 124, that operate according to control packets having different types of packet structures.

Figure 2:
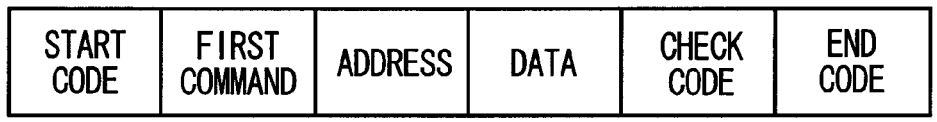
FIG. 2 shows an exemplary configuration of a control packet having the first packet structure generated by the test control section 130.

FIG. 2 shows an exemplary configuration of a control packet having the first packet structure generated by the test control section 130. This control packet includes a start code region, a first command region, an address region, a data region, a check code region, and an end code region.

The start code region stores a start code that has a value for identifying a start position of the control packet. For example, the test control section 130 may store the hexadecimal value 0x12 as the code for this identification. In this case, the first test modules 122 recognize that a control packet is received when the code 0x12 is detected in the received data.

The first command region stores a command for controlling the first test modules 122 and information that identifies whether the packet is for the first test module 122-1 or the first test module 122-2. The command for controlling the first test modules 122 may be a write command ordering writing of the data stored in the data region to a register in the device under test 10, for example.

The address region stores an address of a register in the device under test 10 that is affected by the write command. The data region stores the data to be written to the device under test 10 according to the write command.

The check code region stores a CRC (Cyclic Redundancy Check) code used to detect whether there is a data error in the first command region, the address region, or the data region. The end code region stores an end code indicating the end of the control packet. The end code may be the same type of code as the start code.

Figure 3:
FIG. 3 shows another configuration of a control packet having the first packet structure generated by the test control section 130.

FIG. 3 shows another configuration of a control packet having the first packet structure generated by the test control section 130. This control packet differs from the control packet shown in FIG. 2 in that this control packet does not include the data region. The packet structure of the control packet may used as a read packet for reading data from the device under test 10.

Figure 4:
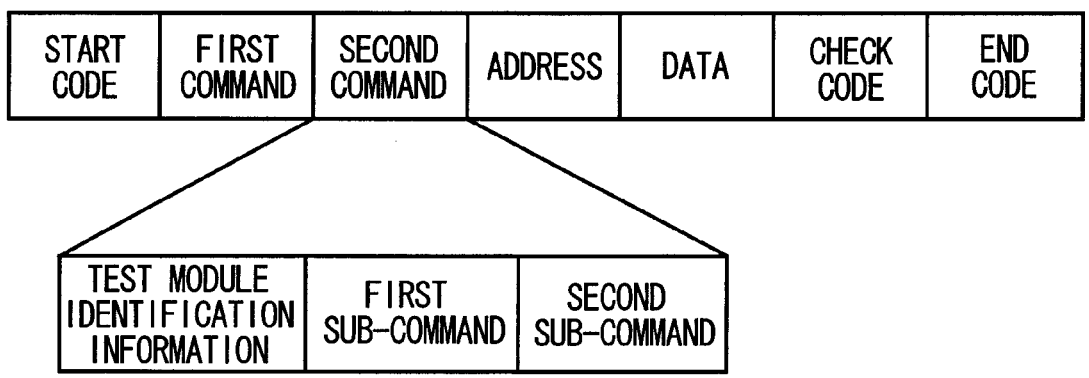
FIG. 4 shows a configuration of a control packet having the second packet structure generated by the test control section 130.

FIG. 4 shows a configuration of a control packet having the second packet structure generated by the test control section 130. This control packet differs from the control packets of FIGS. 2 and 3 in that this control packet further includes a second command region as the expansion region. In other words, a control packet having the second packet structure includes the first command region and the second command region.

The first command region includes a common command that can be used commonly by both the first test modules 122 and the second test modules 124. For example, when the second test modules 124 can use a read command and a write command that can also be used by the first test modules 122, this read command and write command are stored in the first command region as a common command.

The second command region includes a plurality of sub commands ordering a plurality of operations obtained by segmenting the operation ordered by the common command in the expansion region. For example, the second command region may include a test module identification information region, a first subcommand region, and a second subcommand region. The first subcommand region and the second subcommand region store subcommands obtained by segmenting read commands and write commands. The subcommands obtained by segmenting a read command may be a command for reading data from a plurality of addresses in series and a command for reading data simultaneously from a plurality of modules. The commands included in the first subcommand region and the second subcommand region are commands that can be executed by the second test modules 124 but cannot be executed by the first test modules 122.

The test module identification information region stores information that indicates whether the destination of the control packet is the first test modules 122, the second test modules 124, or both the first test modules 122 and the second test modules 124. For example, when a control packet is to be sent to the first test modules 122, the test control section 130 stores the 2-bit data "01" in the test module identification information region. When a control packet is to be sent to the second test modules 124, the test control section 130 stores the 2-bit data "10" in the test module identification information region. When a control packet is to be sent to both the first test modules 122 and the second test modules 124, the test control section 130 stores the 2-bit data "11" in the test module identification information region.

FIG. 5 shows exemplary configurations of commands stored in the first command region and commands stored in the second command region. The first command region, which is used by both the first test modules 122 and the second test modules 124, stores a hexadecimal code CODE that identifies each command. The test control section 130 generates a control packet having the second packet structure and having this code stored in the first command region.

For example, when setting both the first test modules 122 and the second test modules 124 to idle, the test control section 130 stores "0x00" in the first command region. When resetting both the first test modules 122 and the second test modules 124, the test control section 130 stores "0x01" in the first command region. When reading data from both the first test modules 122 and the second test modules 124, the test control section 130 stores "0x02" in the first command region.

When reading data from the device under test 10-2 connected to the second test modules 124, the test control section 130 transmits a control packet in which the sub-code SUB_CODE corresponding to the subcommand is stored in the second command region. For example, when reading data from a specific second test module 124, the test control section 130 stores the subcommand "0x01" corresponding to a single read instruction in the second command region. When reading data simultaneously from a plurality of second test modules 124, the test control section 130 stores the subcommand "0x02" corresponding to a multi-read instruction in the second command region.

The test control section 130 may generate a control packet having the second packet structure in which the first sub command region and the second subcommand region each store their own identification information. Upon receiving this control packet, the second test modules 124 can identify the test control section 130 that transmitted this packet. Accordingly, in response to a read packet received from the test control section 130-1 or the test control section 130-2, the second test modules 124 can transmit a control packet including data read from the device under test 10 to the test control section 130 that sent a read packet.

Figure 6:
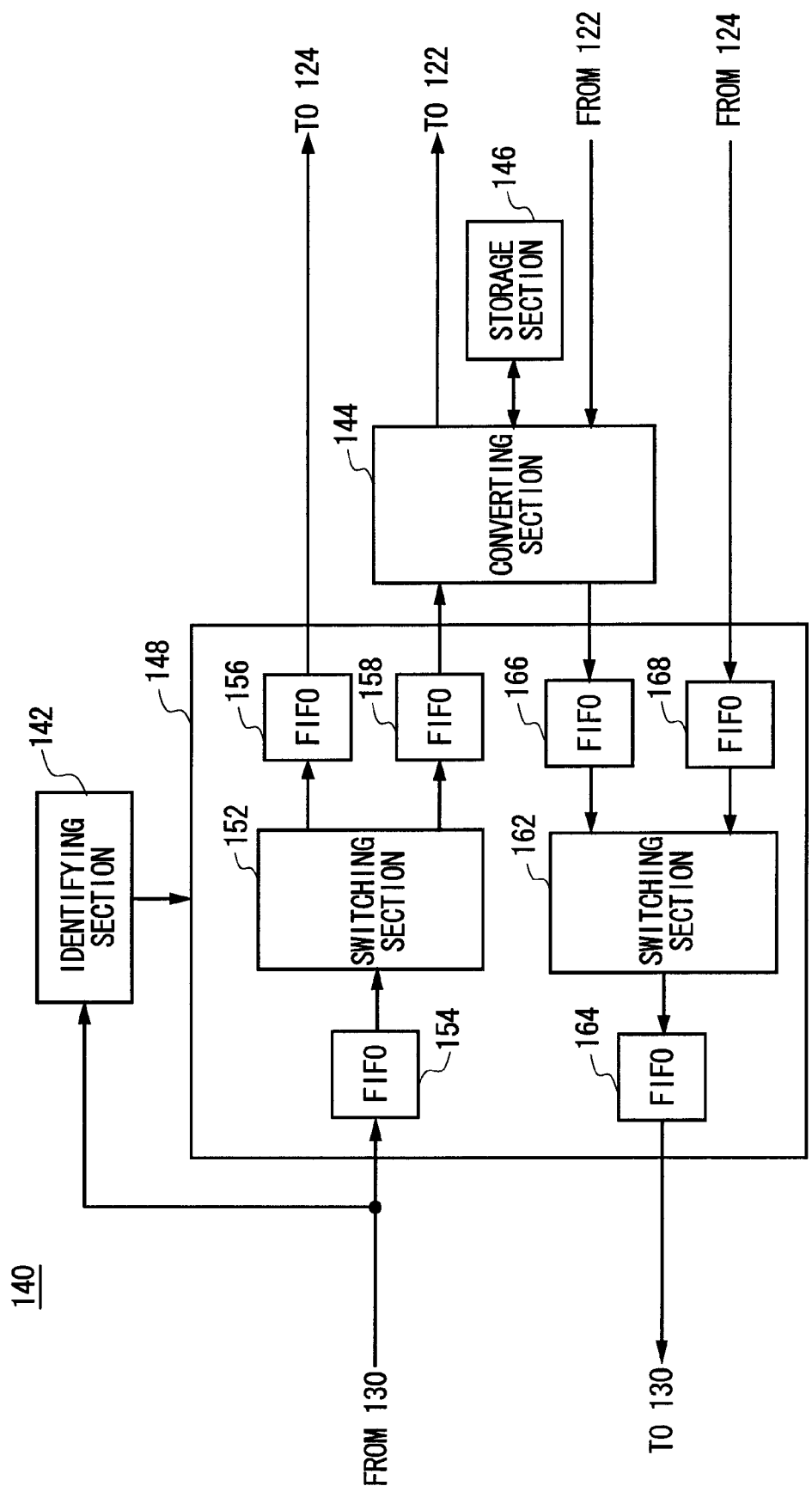
FIG. 6 shows a configuration of the connecting section 140.

FIG. 6 shows a configuration of the connecting section 140. The connecting section 140 includes an identifying section 142, a converting section 144, a storage section 146, and a path switching section 148. The connecting section 140 may include a plurality of path switching sections 148 corresponding respectively to the test control section 130-1 and the test control section 130-2. The connecting section 140 may include a plurality of converting sections 144 and storage sections 146 corresponding respectively to the first test module 122-1 and the first test module 122-2.

The identifying section 142 identifies the test module identification information included in the control packet having the second packet structure received from the test control section 130. The converting section 144 removes the expansion regions, i.e. the second command regions, from control packets having the second packet structure received from the test control section 130. The storage section 146 stores the expansion regions removed by the converting section 144.

When the test module identification information indicating the type of test module that transmits the control packet received from the test control section 130 indicates the first test module 122, the connecting section 140 removes the expansion region from the control packet and transmits the resulting packet to the first test modules 122. When the test module identification information indicates the second test modules 124, the connecting section 140 transmits the control packet to the second test modules 124. More specifically, the connecting section 140 transmits the control packet to the first test modules 122 or the second test modules 124 according to the test module identification information, in the manner described below.

Upon receiving a control packet from the test control section 130, the connecting section 140 inputs the control packet to the identifying section 142 and the path switching section 148. The identifying section 142 extracts the test module identification information from the received control packet and compares this information to information identifying the first test modules 122 and information identifying the second test modules 124, which is stored in advance.

The identifying section 142 controls the path switching section 148 according to the comparison result. For example, when the test module identification information matches the information indicating the first test modules 122, the identifying section 142 inputs to the path switching section 148 a signal having a first logic value, such as the 2-bit logic value "01." When the test module identification information matches the information indicating the second test modules 124, the identifying section 142 inputs to the path switching section 148 a signal having a second logic value, such as the 2-bit logic value "10."

The path switching section 148 includes a switching section 152, a FIFO buffer 154, a FIFO buffer 156, a FIFO buffer 158, a switching section 162, a FIFO buffer 164, a FIFO buffer 166, and a FIFO buffer 168. The switching section 152 switches whether a control packet received from the test control section 130 is transmitted to the first test modules 122 or to the second test modules 124. The switching section 162 switches whether a control packet received from a first test module 122 or a control packet received from a second test module 124 is transmitted to the test control section 130.

The FIFO buffer 154 temporary accumulates the control packets received from the test control section 130. The FIFO buffer 154 accumulates the control packets according to the timing at which the control packets are output from the test control section 130. The FIFO buffer 154 reads the temporarily accumulated control packets according to the timing of a read request input from the switching section 152. The FIFO buffer 154 may have a capacitance greater than the maximum length of the control packets.

The path switching section 148 may initiate reading of the control packets accumulated in the FIFO buffer 154 in response to the input of the first logic value or the second logic value from the identifying section 142. When the first logic value is input, the path switching section 148 inputs the control packets read from the FIFO buffer 154 to the converting section 144 via the FIFO buffer 158. When the second logic value is input from the identifying section 142, the path switching section 148 transmits the control packets read from the FIFO buffer 154 to the second test modules 124 via the FIFO buffer 156.

The path switching section 148 may simultaneously transmit the same control packet to the second test module 124-1 and the second test module 124-2. The path switching section 148 may instead select one of the second test module 124-1 and the second test module 124-2 to transmit a control packet to.

The path switching section 148 may have a plurality of FIFO buffers 158 corresponding respectively to the first test module 122-1 and the first test module 122-2. The path switching section 148 may have a plurality of FIFO buffers 156 corresponding respectively to second test module 124-1 and the second test module 124-2.

Upon receiving a control packet having the second packet structure from the switching section 152, the converting section 144 removes the expansion region, i.e. the second command region, therefrom. The converting section 144 inputs to the storage section 146 the information included in the removed second command region. The converting section 144 transmits the resulting control packet, which is converted to have the first packet structure by the removal of the expansion region, to the first test modules 122. For example, the converting section 144 may simultaneously transmit the control packet to the first test module 122-1 and the first test module 122-2. The converting section 144 may instead select one of the first test module 122-1 and the first test module 122-2 to transmit the control packet to.

The converting section 144 may have a memory that temporarily accumulates the data included in control packets having the second packet structure when converting control packets from the second packet structure to the first packet structure. The converting section 144 may generate a control packet having the first packet structure by sequentially reading the data in the regions other than the second command region from the data temporarily accumulated in the memory.

When the test module identification information indicates that the destination of a packet is both the first test modules 122 and the second test modules 124, the connecting section 140 may transmit the control packet to the second test modules 124 and may remove the expansion region from the control packet to transmit a control packet having the first packet structure to the first test modules 122. For example, when the test module identification information specified by the identifying section 142 indicates the first test modules 122 and the second test modules 124, the identifying section 142 inputs a third logic value, e.g. the 2-bit logic value "11," to the switching section 152.

Upon receiving the third logic value from the identifying section 142, the switching section 152 inputs the control packets read from the FIFO buffer 154 to the converting section 144 via the FIFO buffer 158. Furthermore, the switching section 152 transmits the control packets read from the FIFO buffer 154 to the second test modules 124 via the FIFO buffer 156.

The connecting section 140 generates a control packet having the second packet structure by using the converting section 144 to add the second command region stored in the storage section 146 to the control packet having the first packet structure received from a first test module 122. The connecting section 140 transmits a control packet having the second packet structure generated by the converting section 144 to the test control section 130. The connecting section 140 transmits a control packet having the second packet structure received from a second test module 124 directly to the test control section 130 without passing the packet through the converting section 144.

More specifically, the converting section 144 temporary accumulates the control packets having the first packet structure received from the first test modules 122 in a storage medium such as a memory. The converting section 144 reads from the storage section 146 the data of the second command region stored therein when sending the control packet to the first test modules 122. Furthermore, the converting section 144 generates control packets having the second packet structure by adding the data of the second command region read from the storage section 146 to the control packets having the first packet structures temporarily accumulated in the storage medium, such as the memory.

The converting section 144 inputs the generated control packet having the second packet structure to the switching section 162 via the FIFO buffer 166. Upon receiving the control packet from the FIFO buffer 166, the switching section 162 transmits the control packet to the test control section 130 via the FIFO buffer 164.

A control packet having the second packet structure output by a second test module 124 is input to the FIFO buffer 168 without passing through the converting section 144. Upon receiving the control packet from the FIFO buffer 168, the switching section 162 transmits the control packet to the test control section 130 via the via the FIFO buffer 164.

The path switching section 148 may include a plurality of FIFO buffers 166 corresponding to the first test module 122-1 and the first test module 122-2. The path switching section 148 may include a plurality of FIFO buffers 168 corresponding to the second test module 124-1 and the second test module 124-2.

The switching section 162 may select the FIFO buffer 166 or the FIFO buffer 168 to connect to the FIFO buffer 164 in response to a signal indicating that the data in the FIFO buffer 166 or the FIFO buffer 168 has reached a prescribed amount. More specifically, upon receiving a signal indicating that the buffer is full from the FIFO buffer 166 or the FIFO buffer 168, the switching section 162 inputs to the FIFO buffer 164 the control packet that is input from whichever of the FIFO buffer 166 and the FIFO buffer 168 output the signal indicating that the buffer is full. The switching section 162 may switch whether the FIFO buffer 166 or the FIFO buffer 168 is connected to the FIFO buffer 164 according to the logic value of the signal output by the identifying section 142.

The switching section 162 may switch this connection in synchronization with a connection switching timing of the switching section 152. More specifically, when the switching section 152 transmits a control packet to the first test modules 122 via the converting section 144, the switching section 162 may switch to receive the control packet from the first test modules 122 via the converting section 144 during an interval lasting until the control packet transmitted by the first test modules 122 in response to the control packet is received.

More specifically, when the switching section 152 connects the FIFO buffer 154 to the FIFO buffer 158, the switching section 162 connects the FIFO buffer 166 to the FIFO buffer 164. On the other hand, when the switching section 152 connects the FIFO buffer 154 to the FIFO buffer 156, the switching section 162 connects the FIFO buffer 168 to the FIFO buffer 164.

Figure 7:
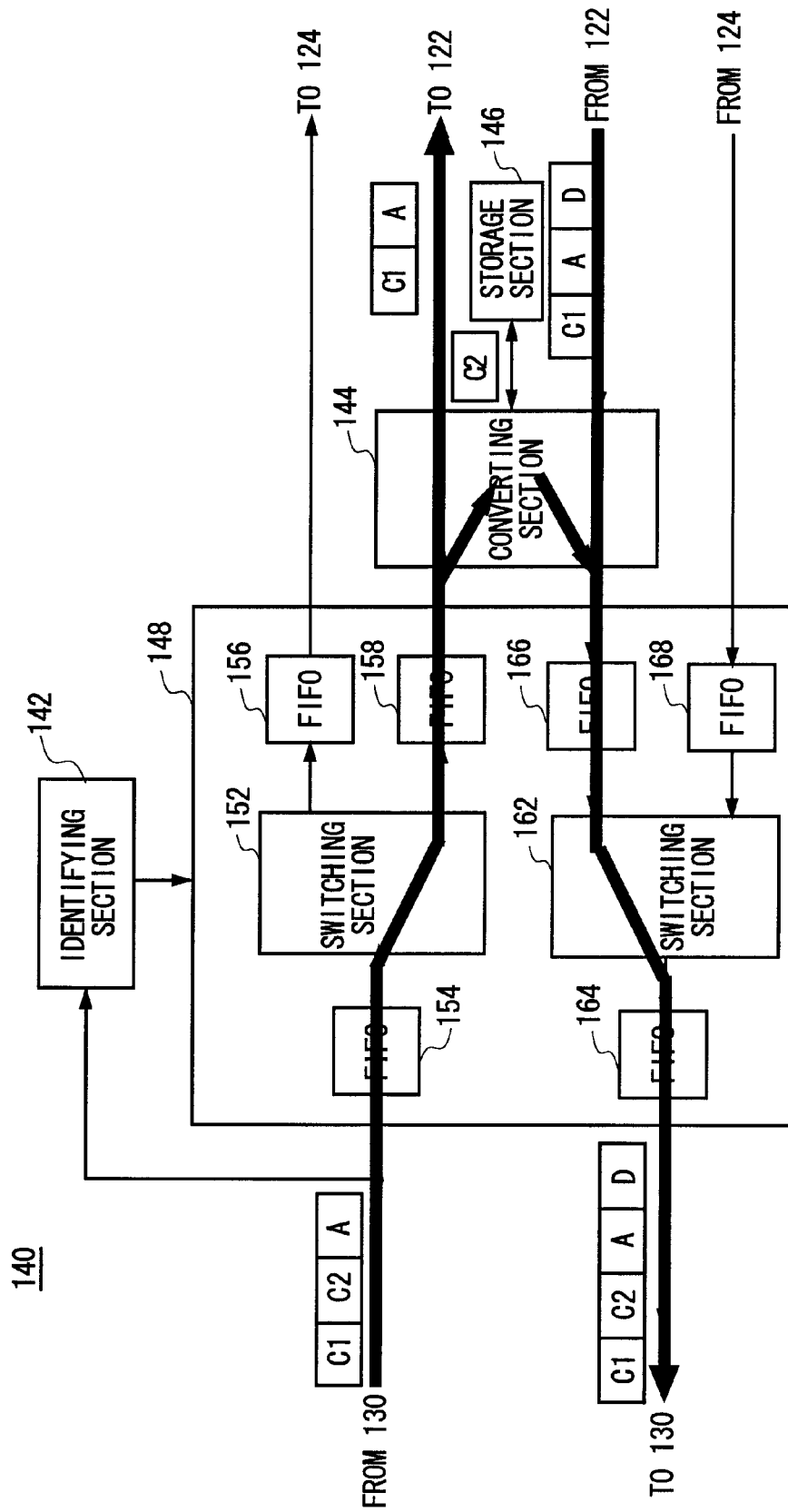
FIG. 7 shows an exemplary data flow in a case where control packets are communicated between the test control section 130 and the first test module 122.

FIG. 7 shows an exemplary data flow in a case where control packets are transmitted between the test control section 130 and the first test modules 122. In FIG. 7, C1 represents the first command region, C2 represents the second command region, A represents the address region, and D represents the data region.

A control packet having the second packet structure output by the test control section 130 is input to the converting section 144 via the path switching section 148. The converting section 144 removes the second command region and stores the data of the removed second command region in the storage section 146. The converting section 144 generates a control packet having the first packet structure that includes the first command region and the address region. The converting section 144 transmits the generated control packet to the first test modules 122.

A first test modules 122 transmits a control packet that has the first packet structure including the first command region, the address region, and a data region in which is stored the data read from the device under test 10-1. Upon receiving this control packet, the converting section 144 adds the second command region that was removed earlier, thereby generating a control packet having the second packet structure including the first command region, the second command region, and the address region. The converting section 144 transmits the control packet having the second packet structure to the test control section 130.

Figure 8:
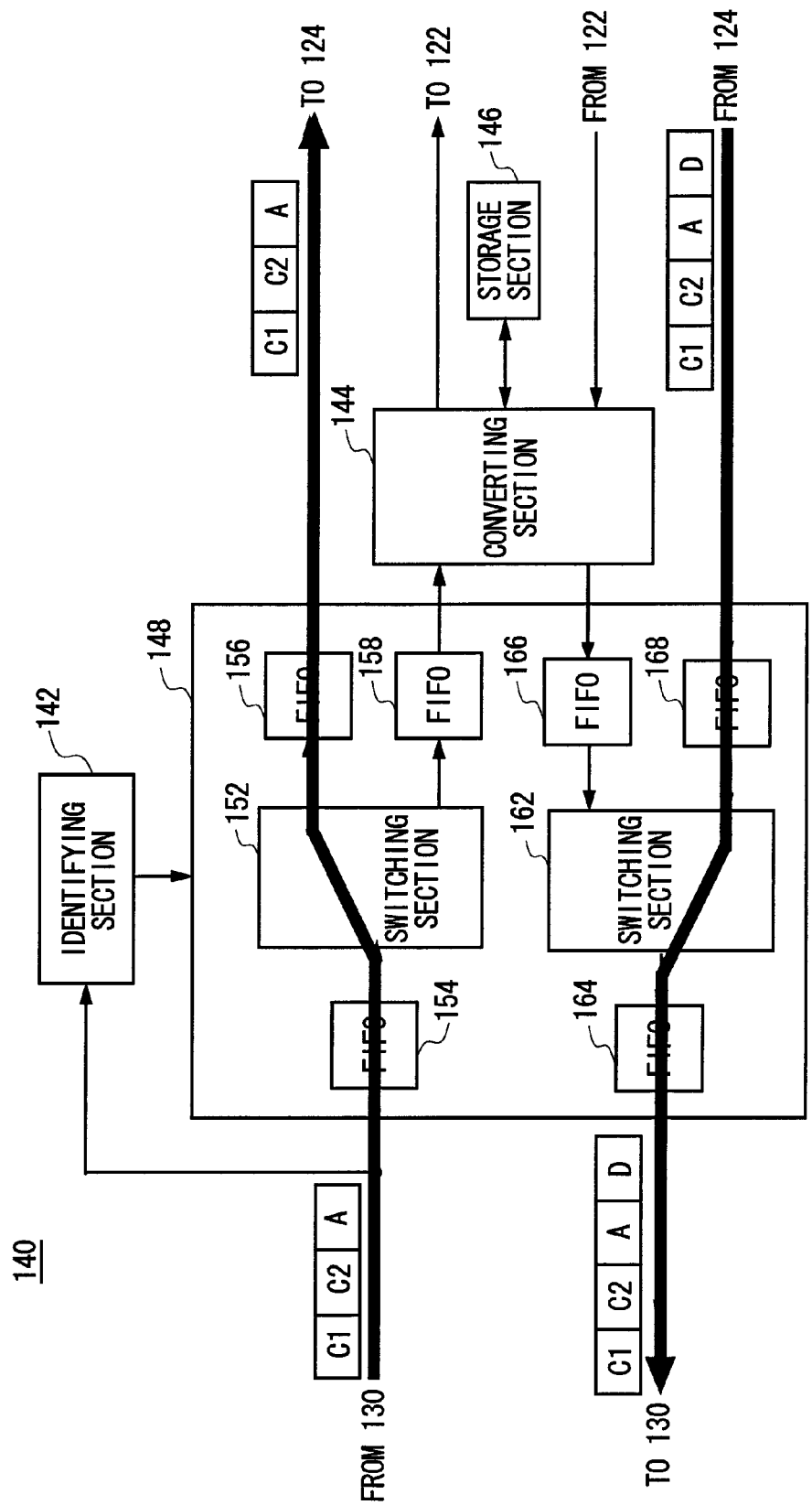
FIG. 8 shows an exemplary data flow in a case where control packets are communicated between the test control section 130 and the second test module 124.

FIG. 8 shows an exemplary data flow in a case where control packets are communicated between the test control section 130 and the second test modules 124. A control packet having the second packet structure output by the test control section 130 is transferred directly to the second test modules 124 without being converted by the converting section 144 to have the first packet structure. A control packet having the second packet structure output by a second test module 124 is transmitted directly to the test control section 130 without passing through the converting section 144.

Figure 9:
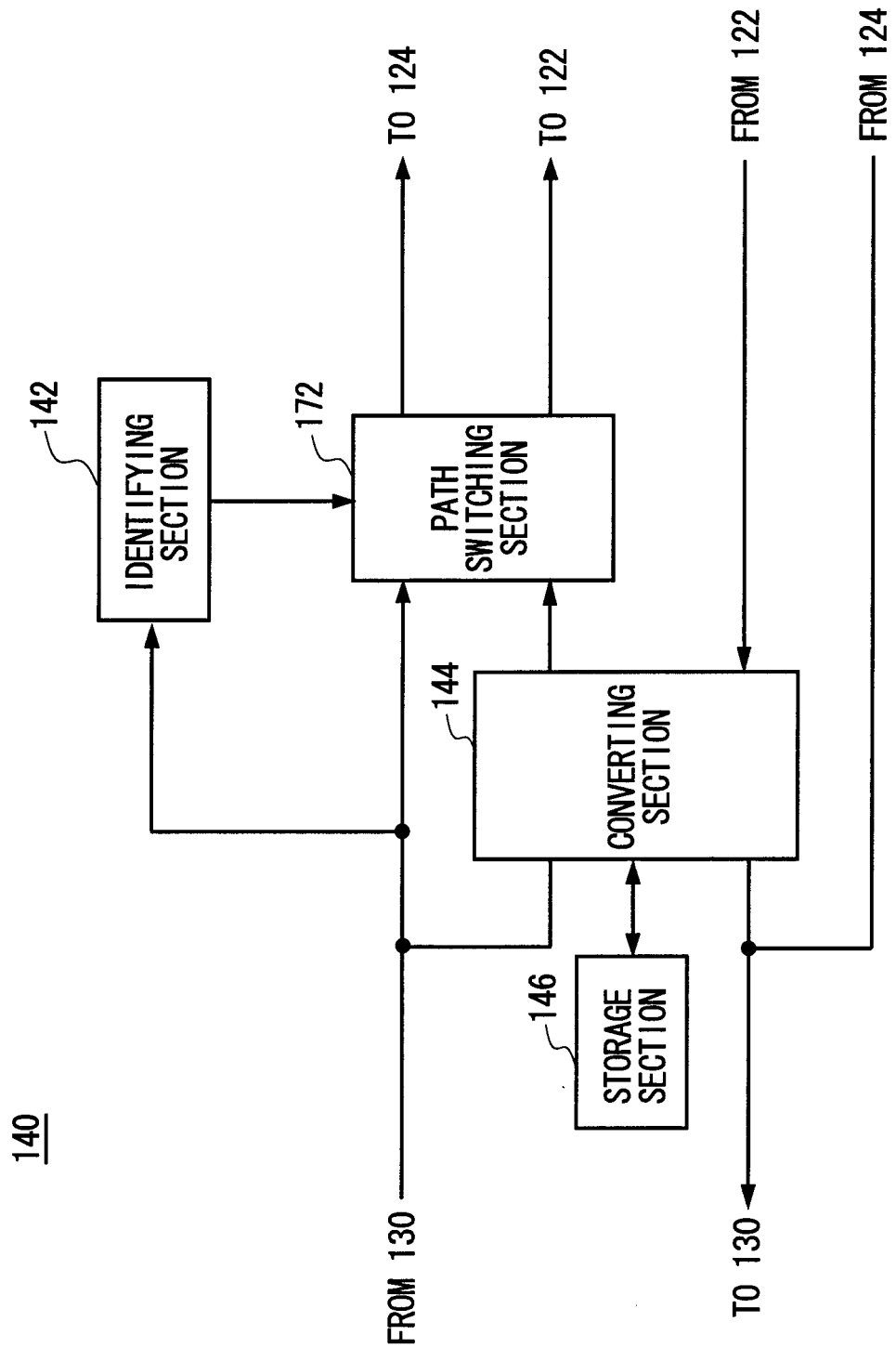
FIG. 9 shows another exemplary configuration of the connecting section 140.

FIG. 9 shows another exemplary configuration of the connecting section 140. The connecting section 140 of FIG. 9 has a path switching section 172 instead of the path switching section 148 shown in FIG. 6.

A control packet having the second packet structure output by the test control section 130 is input to the identifying section 142, the converting section 144, and the path switching section 172. The path switching section 172 switches whether the control packet having the second packet structure received from the test control section 130 and a control packet having the first packet structure received from the converting section 144 are transmitted to the first test modules 122 or to the second test modules 124, according to a signal output by the identifying section 142.

More specifically, when the identifying section 142 determines that the test module identification information included in the control packet received from the test control section 130 indicates the first test modules 122, the identifying section 142 inputs a signal having the first logic value to the path switching section 172. Upon receiving the signal having the first logic value from the identifying section 142, the path switching section 172 transmits the control packet having the first packet structure received from the converting section 144 to the first test modules 122.

When the identifying section 142 determines that the test module identification information included in the control packet received from the test control section 130 indicates the second test modules 124, the identifying section 142 inputs a signal having the second logic value to the path switching section 172. Upon receiving the signal having the second logic value from the identifying section 142, the path switching section 172 transmits to the second test modules 124 the control packet having the second packet structure received from the test control section 130.

When the identifying section 142 determines that the test module identification information indicates both the first test modules 122 and the second test modules 124, the identifying section 142 inputs a signal having the third logic value to the path switching section 172. Upon receiving the signal having the third logic value from the identifying section 142, the path switching section 172 transmits to the first test modules 122 the control packet having the first packet structure received from the converting section 144 and transmits to the second test modules 124 the control packet having the second packet structure received from the test control section 130.

A control packet having the first packet structure output by a first test module 122 is input to the converting section 144. The converting section 144 converts the control packet having the first packet structure received from the first test module 122 into a control packet having the second packet structure. The control packet having the second packet structure generated by the converting section 144 is transmitted to the test control section 130. A control packet having the second packet structure output by a second test module 124 is transmitted directly to the test control section 130 without being converted by the converting section 144.

Figure 10:
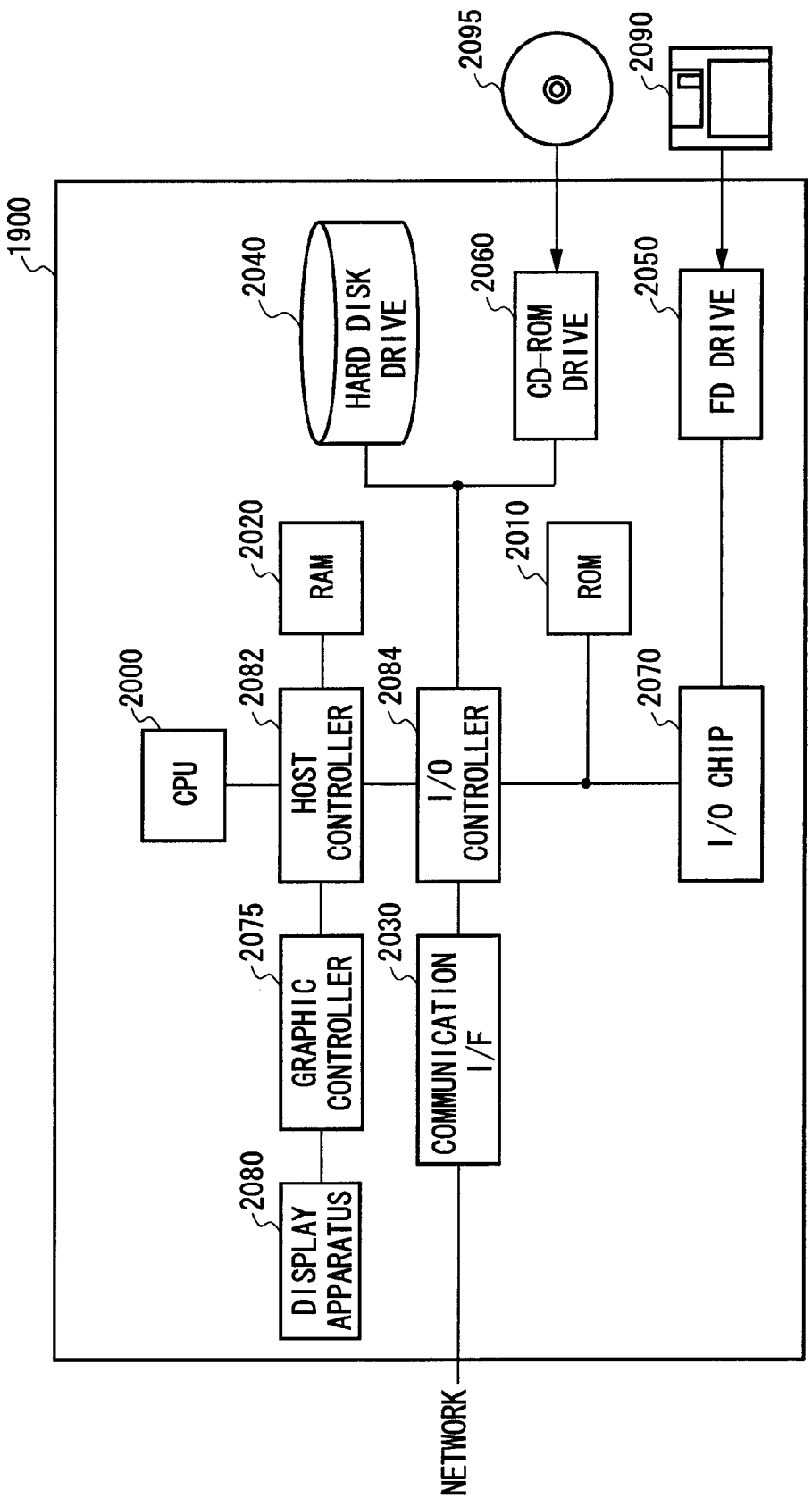
FIG. 10 shows an example of a hardware configuration of a computer 1900 configured to operate as the test apparatus 100 according to another embodiment of the present invention.

FIG. 10 shows an example of a hardware configuration of a computer 1900 configured to operate as the test apparatus 100 according to another embodiment of the present invention. The computer 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, and the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to the input/output controller 2084 along with each of the input/output apparatuses via, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 cause the computer 1900 to function as the test apparatus 100 provided with the test module section 120 for testing the device under test 10, the test control section 130 for generating the control packets for controlling the test module section 120, and the connecting section 140 for receiving the control packets from the test control section 130 and transmitting the control packets to the test module section 120.

More specifically, these programs cause the computer 1900 to control the test module section 120 to function as (i) the first test module 122 that operates according to control packets having the first packet structure and (ii) the second test module 124 that operates according to control packets having the second packet structure, which is obtained by adding an expansion region to a control packet having the first packet structure. Furthermore, the programs cause the computer 1900 to control the test control section 130 to transmit control packets having the second packet structure to the connecting section 140. Yet further, the programs cause the computer 1900 to control the connecting section 140 to (i) remove the expansion regions from control packets having the second packet structure received from the test control section 130 and transmit the resulting control packets to the first test module 122 and to (ii) transmit control packets having the second packet structure received from the test control section 130 to the second test module 124.

The information processes recorded in these programs are read by the computer 1900 to cause the computer 1900 to function as software and hardware described above, which are exemplified by the specific sections of the test module section 120, the test control section 130, and the connecting section 140. With these specific sections, a unique test apparatus 100 suitable for an intended use can be configured to function by realizing the calculations or computations appropriate for the intended use of the computer 1900 of the present embodiment.

For example, if there is communication between the computer 1900 and an external apparatus or the like, the CPU 2000 performs the communication program loaded in the RAM 2020, and provides the communication interface 2030 with communication processing instructions based on the content of the process recorded in the communication program. The communication interface 2030 is controlled by the CPU 2000 to read the transmission data stored in the transmission buffer area or the like on the storage apparatus, such as the RAM 2020, the hard disc 2040, the flexible disk 2090, or the CD-ROM 2095, and send this transmission data to the network, and to write data received from the network onto a reception buffer area on the storage apparatus. In this way, the communication interface 2030 may transmit data to and from the storage apparatus through DMA (Direct Memory Access). As another possibility, the CPU 2000 may transmit the data by reading the data from the storage apparatus or communication interface 2030 that are the origins of the transmitted data, and writing the data onto the communication interface 2030 or the storage apparatus that are the transmission destinations.

The CPU 2000 may perform various processes on the data in the RAM 2020 by reading into the RAM 2020, through DMA transmission or the like, all or a necessary portion of the database or files stored in the external apparatus such as the hard disk 2040, the CD-ROM drive 2060, the CD-ROM 2095, the flexible disk drive 2050, or the flexible disk 2090. The CPU 2000 writes the processed data back to the external apparatus through DMA transmission or the like.

In this process, the RAM 2020 is considered to be a section that temporarily stores the content of the external storage apparatus, and therefore the RAM 2020, the external apparatus, and the like in the present embodiment are referred to as a memory, a storage section, and a storage apparatus. The variety of information in the present embodiment, such as the variety of programs, data, tables, databases, and the like are stored on the storage apparatus to become the target of the information processing. The CPU 2000 can hold a portion of the RAM 2020 in a cache memory and read from or write to the cache memory. With such a configuration as well, the cache memory serves part of the function of the RAM 2020, and therefore the cache memory is also included with the RAM 2020, the memory, and/or the storage apparatus in the present invention, except when a distinction is made.

The CPU 2000 executes the various processes such as the computation, information processing, condition judgment, searching for/replacing information, and the like included in the present embodiment for the data read from the RAM 2020, as designated by the command sequence of the program, and writes the result back onto the RAM 2020. For example, when performing condition judgment, the CPU 2000 judges whether a variable of any type shown in the present embodiment fulfills a condition of being greater than, less than, no greater than, no less than, or equal to another variable or constant. If the condition is fulfilled, or unfulfilled, depending on the circumstances, the CPU 2000 branches into a different command sequence or acquires a subroutine.

The CPU 2000 can search for information stored in a file in the storage apparatus, the database, and the like. For example, if a plurality of entries associated respectively with a first type of value and a second type of value are stored in the storage apparatus, the CPU 2000 can search for entries fulfilling a condition designated by the first type of value from among the plurality of entries stored in the storage apparatus. The CPU 2000 can then obtain the second type of value associated with the first type of value fulfilling the prescribed condition by reading the second type of value stored at the same entry.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus provided with a plurality of types of test modules that operate according to packets having different packet structures.

What is claimed is:

1. A test apparatus that tests a device under test, comprising:
   a test module section that tests the device under test;
   a test control section that generates control packets for controlling the test module section; and
   a connecting section that receives the control packets from the test control section and transmits the control packets to the test module section, wherein
   the test module section includes a first test module that operates according to control packets having a first packet structure and a second test module that operates according to control packets having a second packet structure, which is obtained by adding an expansion region to a control packet having the first packet structure,
   the test control section transmits control packets having the second packet structure to the connecting section, and the connecting section (i) removes the expansion region from control packets having the second packet structure received from the test control section and transmits the removed-expansion-region control packets to the first test module, and (ii) transmits control packets having the second packet structure received from the test control section to the second test module.

2. The test apparatus according to claim 1, wherein the connecting section includes a converting section that removes the expansion region, and a storage section that stores the expansion region removed by the converting section.

3. The test apparatus according to claim 2, wherein when test module identification information, which is included in a control packet received from the test control section and indicates a type of the test module that transmitted the control packet, indicates the first test module, the connecting section removes the expansion region from the control packet, transmits the removed-expansion-region control packet to the first test module, and stores the removed expansion region in the storage section, and when the test module identification information indicates the second test module, the connecting section transmits the control packet to the second test module.

4. The test apparatus according to claim 3, wherein the test control section generates control packets having the second packet structure to include the test module identification information indicating whether a destination of the control packet is the first test module, the second test module, or both the first test module and the second test module.

5. The test apparatus according to claim 4, wherein when the test module identification information indicates that the destination of the control packet is both the first test module and the second test module, the connecting section (i) transmits the control packet to the second test module and (ii) removes the expansion region from the control packet and transmits the removed-expansion-region control packet having the first packet structure to the first test module.

6. The test apparatus according to claim 2, wherein the connecting section generates a control packet having the second packet structure by using the converting section to add the expansion region stored in the storage section to a control packet having the first packet structure received from the first test module, and transmits the generated control packet having the second packet structure to the test control section, and the connecting section transmits a control packet having the second packet structure received from the second test module to the test control section without passing the control packet having the second structure through the converting section.

7. The test apparatus according to claim 1, wherein the test control section generates the control packets to include in the expansion region thereof commands that can be performed by the second test module but cannot be performed by the first test module.

8. The test apparatus according to claim 7, wherein the test control section generates the control packets to include, in a region thereof other than the expansion region, a common command that can be used by both the first test module and the second test module and to include, in the expansion region, a plurality of subcommands that order a plurality of operations that are obtained by segmenting an operation ordered by the common command.

9. A method for testing a signal device under test using a test module section that includes a first test module that operates according to control packets having a first packet structure and a second test module that operates according to control packets having a second packet structure, which is obtained by adding an expansion region to a control packet having the first packet structure, the method comprising:
generating control packets having the second packet structure to control the test module section; and
(i) removing the expansion region from the control packets having the second packet structure and transmitting the removed-expansion-region control packets to the first test module, and (ii) transmitting the control packets having the second packet structure to the second test module.

10. A non-transitory recording medium storing thereon a program for causing a computer to function as a test apparatus comprising a test module section that tests a device under test, a test control section that generates control packets for controlling the test module section, and a connecting section that receives the control packets from the test control section and transmits the control packets to the test module section, wherein
the program causes the test module section to function as a first test module that operates according to control packets having a first packet structure and as a second test module that operates according to control packets having a second packet structure, which is obtained by adding an expansion region to a control packet having the first packet structure,
the program causes the test control section to transmit control packets having the second packet structure to the connecting section, and
the program causes the connecting section to (i) remove the expansion region from control packets having the second packet structure received from the test control section and transmit the removed-expansion-region control packets to the first test module, and to (ii) transmit control packets having the second packet structure received from the test control section to the second test module.

* * * * *